United States Patent [19]

Swerlein et al.

[11] Patent Number: 4,663,586
[45] Date of Patent: May 5, 1987

[54] DEVICE WITH AUTOMATIC COMPENSATION OF AN AC ATTENUATOR

[75] Inventors: Ronald L. Swerlein, Longmont; Lawrence A. DesJardin; Scott Stever, both of Loveland, all of Colo.

[73] Assignee: Hewlett-Packard Company, Palo Alto, Calif.

[21] Appl. No.: 729,507

[22] Filed: May 2, 1985

[51] Int. Cl.$^4$ ............................................. G01R 35/00
[52] U.S. Cl. ................................. 324/115; 324/57 R; 324/57 PS; 324/130; 364/571
[58] Field of Search ............... 324/115, 130, 102, 126, 324/57 R, 57 PS; 364/483, 571, 579, 580; 328/162

[56] References Cited

U.S. PATENT DOCUMENTS

| 4,200,933 | 4/1980 | Nickel et al. | 324/130 X |
| 4,253,057 | 2/1981 | Carlton et al. | 324/57 PS |
| 4,364,027 | 12/1982 | Murooka | 324/130 X |
| 4,553,091 | 11/1985 | Bristol | 324/115 X |
| 4,608,657 | 8/1986 | Manome et al. | 324/57 PS X |

Primary Examiner—Reinhard J. Eisenzopf
Assistant Examiner—Stephen M. Baker
Attorney, Agent, or Firm—Edward L. Miller

[57] ABSTRACT

An ac measuring instrument automatically compensates an input attenuator to achieve precision frequency response. The output of the input attenuator is applied to both the conventional measurement portion of the instrument and to an amplifier of variable gain. The output of the variable gain amplifier drives either a resistive or capacitive impedance coupled to the output of the input attenuator. The impedance is thus driven by a voltage that is a scaled replica of the output of the input attenuator. That scale factor may vary from near zero to greater than one, and the impedance acts as a virtual trimmer whose apparent value varies as the scale factor of its actual value according to the gain established for the variable gain amplifier. The proper gain therefor is determined by a servo loop that applies a test pulse to the input attenuator and subsequently samples the output thereof at least twice. An amplitude difference in the samples indicates an exponential component that arise from an uncompensated attenuator. The servo loop is responsive to the signed difference between the samples to adjust the value of the virtual trimmer until the signed difference is sufficiently near zero. Proper choice of the time interval between samples will adjust the servo loop to be most sensitive to exponential components of certain time constants rather than others. This allows the servo loop to ignore the effects of dielectric absorbtion while compensating the attenuator.

20 Claims, 9 Drawing Figures

FIG 7

DEVICE WITH AUTOMATIC COMPENSATION OF AN AC ATTENUATOR

FIELD OF THE INVENTION

The invention described herein pertains to the measurement of alternating current (ac) phenomena with an instrument incorporating an input attenuator, and especially to such measurements where frequency response considerations dictate that the attenuator be of the compensated type having equal time constants for each section. More specifically, the invention pertains to the accurate and automatic compensation of such an attenuator, particularly in cases where precision measurements are being performed.

BACKGROUND OF THE INVENTION

The accuracy of ac measuring instruments such as voltmeters or oscilloscopes is affected by the stability of the components used therein. For instruments whose accuracies are on the order of one tenth of one percent or better, the variable capacitors used to adjust the compensation of the input attenuator need to be extremely stable if the instrument is to stay calibrated for any appreciable length of time. Changes in temperature or humidity and aging are among those things that can alter the values of capacitors in an attenuator and cause changes in frequency response that can severely degrade accuracy.

In principle, an attenuator can be recompensated at any time. Sometimes this is actually practical, as in the familiar case of compensating the external attenuator probe of an oscilloscope. But there are at least two reasons for the ease with which that can be done. First, it doesn't need to be done with any great regularity. One would be fortunate to make a one percent measurement with an oscilloscope, let alone a one tenth of one percent measurement. So the stability of the trimmer and other capacitors involved seems high since they are adaquate for the measurement environment in which they are being used. Next, the adjustment itself is physically easy to perform since the trimmer to be varied is readily accessible on the probe itself. It is neither part of a main input attenuator that is located behind the front panel nor otherwise buried within the innards of the instrument.

In practice, however, it may not be practical to frequently recompensate an internal attenuator when the required accuracy is considerably greater and the physical placement of the trimmer cannot, for whatever reason, be upon the front panel. Consider the problem of compensating the internal attenuator of an ac voltmeter accurate to one tenth of one percent. First of all, the stability of the trimmer becomes a very significant concern. A change in capacitance of even one one hundredth of a picofarad can be intolerably large. Next, it may be difficult to avoid the introduction of unwanted reactance in the compensation network if it includes a component for front panel adjustment when the rest of the attenuator is some distance away. And finally, in high accuracy applications a real problem of user convenience begins to arise. If the instrument frequently needs to have the attenuator recompensated then that extra overhead can become a burden. It would be desirable if compensation could be done as frequently as needed without any inconvenience that might otherwise discourage necessary compensation. Such inconvenience could easily lead to erroneous measurements by an inattentive operator. Automatic and rapid compensation would be a desirable feature, especially if it could be accurately done at low cost. Since many measurement instruments now also incorporate microprocessors for other purposes anyway, it would also be desirable if such an automatic compensation scheme relied upon a microprocessor to the greatest extent possible to thus minimize the need for additional hardware mechanisms within the instrument.

SUMMARY OF THE INVENTION

The automatic compensation of an ac attenuator may be accomplished in conjunction with the application of a step voltage to the attenuator. A microprocessor may control the application of the step and cause the output of the attenuator to be sampled at a time very shortly after the step, and then again some time later. To digress briefly, a properly compensated attenuator will produce an exact replica of the applied step, except that its amplitude is scaled in accordance with the attenuation ratio. That is, a ten volt step applied to a well compensated 10:1 attenuator will produce a one volt step that is otherwise an exact image of the applied step. Assuming that the sampling times are $t_1$ and $t_2$ and that the applied ten volt step is flat (i. e., it has the same amplitude at times $t_1$ and $t_2$ as well as at all times inbetween) then a compensated 10:1 attenuator will produce as its output a replica that has an amplitude of one volt at times $t_1$ and $t_2$ (as well as at all times inbetween). If it is known that the input step is flat then equality between the samples of the output at times $t_1$ and $t_2$ indicates that the attenuator is indeed compensated.

It will be noted that for the purpose of determining compensation the exact amplitudes of the output at times $t_1$ and $t_2$, and the exact amplitude of the applied step, are not of special concern. They are related by the attenuation ratio, which in the present situation need not be of any particular value. What is of interest is that, provided that the applied step is flat, the relative amplitudes of the output samples at times $t_1$ and $t_2$ are indicative of the state of attenuator compensation.

Under the control of an algorithm a microprocessor applies a flat step to the attenuator and causes the output thereof to be sampled. In a first preferred embodiment to be described the microprocessor causes a variation in the effective capacitance to ground at the output of the attenuator. The signed difference in amplitude between the samples taken at $t_1$ and $t_2$ is used as the input to a servo loop that controls the effective value of the capacitance mentioned above. The servo loop sets the effective value of the capacitance so that the samples at $t_1$ and $t_2$ have equal amplitudes. Following this, the conditions required to obtain that effective value of capacitance are saved and implemented while the instrument is used to make the measurements for which it is intended. This automatic compensation feature may be performed by the operator at will by the mere touch of a button.

Here is how the variable capacitance is obtained. The output of the attenuator is taken from a point at which there is a parallel combination of resistance and overall capacitance to ground. The capacitance is divisible into stray, fixed and trimmer parts that are in parallel. The stray part resembles some generally unchanging value arising from the physical properties of the circuitry. The fixed part is an actual fixed capacitor that is connected between the output of the attenuator and ground, and whose effective capacitance is its actual capacitance. The trimmer part of the overall capacitance is a fixed capacitor whose effective capacitance is a controllable fractional portion of its actual physical capacitance. This result is obtained by connecting the trimmer capacitor between the output of the attenuator and a voltage that is a selected fractional replica of the voltage appearing at the output of the attenuator. If the maximum effective value of the trimmer is needed then the fraction is selected to be near zero. The trimmer is then essentially grounded and its effective capacitance approaches its actual physical capacitance. If, on the other hand, the minimum effective value of the trimmer is needed the fraction is selected to be near one. Then there is essentially no voltage drop across the trimmer, and hence no current through it. It is as though it were not there, or perhaps connected to the output of the attenuator but left open at the other end. It may be shown that the effective value of the trimmer varies linearly with the selected fraction used to produce the replica of the voltage at the output of the attenuator. Any suitable variable gain amplifier may be used to produce the replica. For example, it can be obtained by applying an amplified version of the output of the input atttenuator to a programmable attenuator, whose ouput is in turn amplified and applied to the driven end of the trimmer capacitance. The microprocessor mentioned above controls the programmable attenuator, which may be any of a number of commercially available digital-to-analog converters (DAC's). Since the physical state of the trimmer capacitor is not altered to vary its effective capacitance, we may refer to it as a "virtual trimmer" capacitor.

In a second preferred embodiment a virtual trimmer resistor, rather than a virtual trimmer capacitor, is connected between the output of the attenuator and the selected fractional replica of the voltage appearing at that output. The application of the step voltage and the general operation of the servo loop remain as described. However, whereas the electrically variable virtual trimmer capacitor varied in effective value from nearly zero to its actual physical value, the electrically variable trimmer resistor varies from its actual physical resistance to nearly infinite resistance. Also, upon reflection it will be appreciated that while equality between samples at times $t_1$ and $t_2$ is still the goal, a difference between $t_1$ and $t_2$ that causes a greater fractional replica in the case of a virtual trimmer capacitor must cause a lesser fractional replica in the case of a virtual trimmer resistor.

In either embodiment compensation of the input attenuator is obtained by adjusting the RC time constant of the "grounded" section of the attenuator to match that of the "input" section. To do that the servo loop electrically adjusts the apparent value of a virtual trimmer component having an apparent nominal center value. To optimize or ensure successful operation of the servo loop, it may be desirable for there to be additional physically variable trimmers in the attenuator. These allow initially setting the aggregate values in the attenuator to be such that, while in operation with the servo controlled virtual trimmer, compensation obtains with a median value of contribution by the virtual trimmer. In other words, the range of adjustment afforded by the servo loop must match the need, and not be skewed to one end. The size of the apparent change in the virtual trimmer is limited by the actual physical value thereof; whether or not any of those values will actually compensate the attenuator is another question. To initally adjust the attenuator itself so that it becomes compensatable is why these additional physical trimmers may be needed. Once set, these additional trimmers would likely never need to be changed except subsequent to a replacement of some component in the attenuator.

Finally, for both preferred embodiments it is possible to select particular values for the sample times $t_1$ and $t_2$ that optimize the response of the servo loop to voltage differences arising from the native time constant of the input attenuator. This reduces the degree that the servo loop responds to effects such as dielectric absorbtion that can add the voltages of other time constants to the voltage difference between the samples taken at $t_1$ and $t_2$.

BRIEF DESCRIPTION OF THE DRAWINGS

FIG. 1(A & B) is a front view of the display and keyboard of one actual electronic digital multimeter incorporating the invention of automatic servo controlled compensation of the ac input attenuator;

DESCRIPTION OF A FIRST PREFERRED EMBODIMENT

Figure 1A:
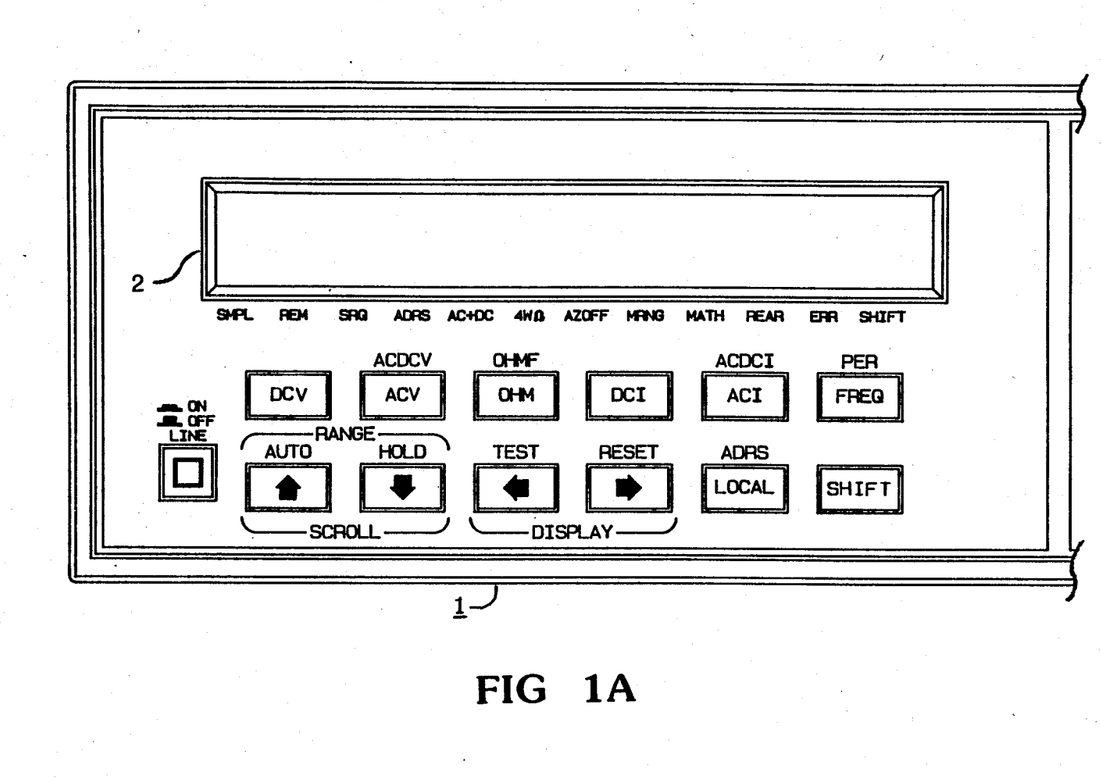
Figure 1B:
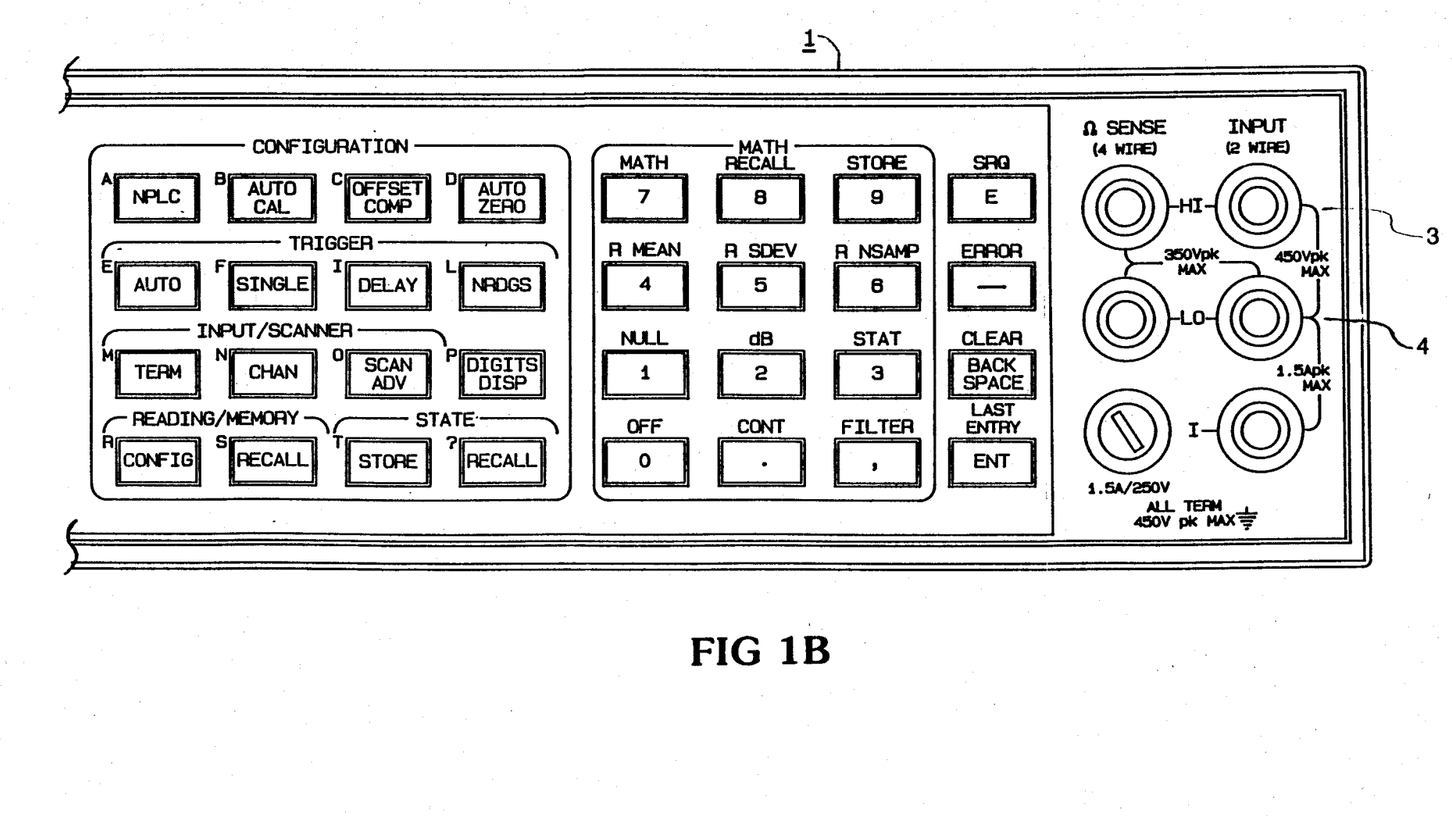

FIG. 1 is a line drawing of the front panel 1 of a digital multimeter (sometimes referred to hereafter as the "multimeter" or simply as the "instrument") incorporating the invention. In particular, the multimeter whose front panel 1 is shown in FIG. 1 includes, for use in ac voltage measurements, an automatically compensatable ac attenuator. This and other features of the instrument are realized in an embodiment including a microprocessor cooperating with various pushbutton keys on a front panel 1 and a multidigit digital display 2. The front panel 1 also includes input terminals 3 and 4 through which an ac input voltage may be applied to the instrument.

Figure 2:
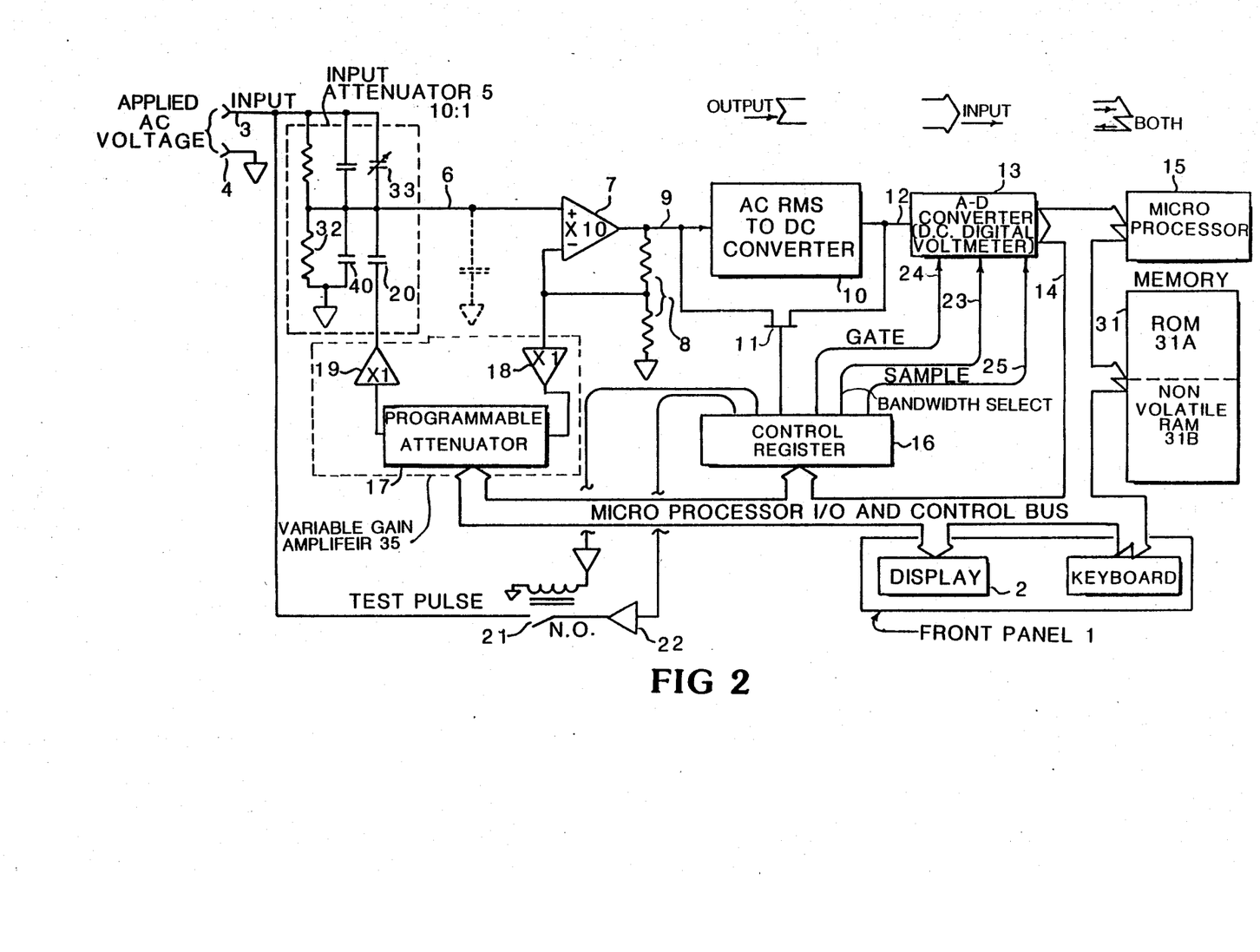
FIG. 2 is a simplified block diagram of a first preferred embodiment of the invention.

Referring now to FIG. 2, shown therein is a partial block diagram of the entire instrument. The portion that is shown pertains to the measurement of ac voltages as well as to the automatic attenuator compensation feature mentioned above. In the interest of brevity there have been omitted certain other portions present in one actual product that incorporates the invention and that otherwise resembles the block diagram of FIG. 2. That actual product is the Hewlett-Packard Model 3457A Digital Multimeter. Further in the interest of brevity, certain simplifying liberties have been taken within the scope of that portion that is shown in FIG. 2. It is to be understood, however, that these simplifications relate principally to matters of choice in the implementation and in no way interfere with an appreciation of the principles of the invention.

The block diagram of FIG. 2 includes input terminals (3,4) through which the input ac voltage to be measured is applied to the instrument. The input terminals are electrically connected to a compensated 10:1 (or perhaps a 100:1) input attenuator 5 whose output 6 is coupled to the input of an operational amplifier 7 for which feedback network 8 provides a gain of ten. The output 9 of the amplifier 7 is coupled to a converter 10 that produces a dc output voltage that is proportional to the rms value of the voltage applied thereto, including both the ac and dc components of that voltage. The converter 10 is selectably bypassed by CMOS switch 11, whose source and drain are respectively connected to the input and output of the converter 10. The output 12 of the converter 10 is applied to an analog to digital converter 13, where the rms value of the applied ac voltage is rendered into digital form and made available to a bus 14 that is also connected to a microprocessor 15. Microprocessor controlled bus 14 is also further coupled to: the display 2; the keyboard portion of the front panel 1; a memory 31 comprising ROM portion 31A and non volatile RAM portion 31B; a control register 16; and a variable gain amplifier 35 that may in turn include a programmable attenuator 17.

Control register 16 is illustrative of one way the microprocessor 15 can control the various elements in the instrument and put various operational modes into effect. Various other control schemes may be desirable, depending upon the circumstances. What FIG. 2 seeks to convey is simply a particular collection of control capabilities applicable to the other elements of the block diagram, and not necessarily any one special way of obtaining that control. Those particular control capabilities are: control of the bypass switch 11; control of when in time the a-d converter 13 samples the dc voltage applied thereto; the optional gating of the a-d converter 13 to better prevent saturation and other ill effects during expected periods of overload or transients; the optional selection of the bandwidth (transient response) of the a-d converter 13; and, the generation of a test pulse and its application through an isolation relay 21 to the input attenuator 5.

Programmable attenuator 17 within the variable gain amplifier 35 is responsive to ten bits of information conveyed by bus 14, and provides attenuation ratios that range from 1:1 to 1024:1. Attenuator 17 provides programmable attenuation of a signal that is the functional equivalent of the signal that appears at the output 6 of the input attenuator 5, although it is not obtained from that output 6 directly. To obtain that equivalent signal an amplifier 18 of unity gain is coupled to the feedback network 8 of operational amplifier 7. It is the output of amplifier 18 that is applied to the signal input of programmable attenuator 17. The output signal from programmable attenuator 17 is applied to another unity gain amplifier 19 whose output drives what would otherwise be the grounded terminal of a virtual trimmer capacitor 20 within the main input attenuator 5. In this way the signal at the output of amplifier 19 is a noninverted adjustably scaled replica of the signal appearing on output line 6.

The preceding paragraph illustrates one way to implement variable gain amplifier 35. Not only are other implementations possible, but it may also be desirable to produce gains that vary over a larger range than simply from zero to one. For example, it may be desirable if the gain is variable from, say, zero to three. Similarly, it may be desirable if the variable gain amplifier 35 exhibits inversion of its output with respect to its input. All of these further possibilities apply equally well to the second preferred embodiment, too. Accordingly, discussion of these alternate possibilities will be deferred until both embodiments have been described in terms of unity gain amplifiers 18 and 19 in cooperation with programmable attenuator 17.

The compensation of the input attenuator 5 is achieved by properly selecting the amount of attenuation provided by programmable attenuator 17. In short, insofar as it contributes to the compensation of the input attenuator 5, the apparent capacitance of virtual trimmer capacitor 20 (as seen by the rest of the attenuator) is a function of the magnitude of the voltage impressed across it. All other things being equal, a capacitor with nearly the same voltage at each end carries less current than does the same capacitor experiencing a greater applied voltage difference, and hence appears to the rest of the attenuator as having a greater capacitive reactance or, what is equivalent, a lesser capacitance. In this way, the effective value of capacitor 20 is made to vary by changing the attenuation ratio of programmable attenuator 17, as that controls how nearly the "bottom end" of capacitor 20 has the same applied voltage as the end connected to the output 6 of the input attenuator 5. In turn, this is made to accomplish the compensation of the input attenuator 5 just as surely as if the capacitor 20 were in fact physically variable in actual capacitance.

Virtual trimmer capacitor 20 may in fact be a physically variable "trimmer" capacitor. If so, then that would be strictly for ease in initial adjustment of the instrument and for determining the range of adjustability that it appears to possess when operated as a virtual trimmer, as will be described. One would not compensate the input attenuator 5 with such a physically variable device for the reasons of stability and convenience previously set out. For these reasons, capacitor 20 could also simply be a fixed capacitor of an appropriate and sufficient value.

Here is a description of how the input attenuator 5 is compensated. First, the user removes any input voltage being applied to the input terminals 3 and 4. This might also be accomplished automatically by the use of another relay (not shown) under the control of the microprocessor 15. Such a relay would break the connection between input terminal 3 and the input attenuator 5. Alternatively, relay 21 could have single-pole double-throw contacts that connect the input attenuator 5 to either the input voltage or the test pulse. Regardless of whether the input voltage is removed manually or automatically, the user instructs the instrument to perform the automatic compensation by pressing a sequence of keys on the front panel keyboard. In the HP Model 3457A for example, one such sequence is the "AUTO CAL" key followed by the digit key "2". (The instrument is capable of performing various other auto-calibration procedures, of which the ac flatness procedure is merely but one. Other digits indicate the other AUTO CAL operations.) In response to the recognition by the microprocessor 15 of the designated sequence the following chain of events is set in motion.

First, the normally open relay 21 is closed. This allows the application of a test pulse to the input attenuator 5. The repetition rate of the test pulse may be any convenient value. A rate of one thousand test pulses per second is a reasonable and practical rate. Relay 21 is normally open to prevent the test pulse generation circuitry 22 from being coupled to (and hence loading) the user's circuitry under measurement, as well as to prevent damage to the pulse generator circuitry by the application of destructive voltages or currents to the input terminals 3 and 4.

The closure of relay 21, as well as the activation of any of various other functions controlled by microprocessor 15, is accomplished by sending an appropriate control word to the control register 16. Each function controlled by register 16 is responsive to the presence or absence of an associated bit therein. To change a controlled function the microprocessor sends to register 16 a new word differing from the previous word by that bit.

At the same time relay 21 is closed bypass switch 11 is also turned on, bandwidth select 23 set to specify maximum bandwidth in a-d converter 13, and gate 24 for converter 13 is turned off. Sample control line 25 remains low, indicating that no new sample is presently desired.

Figure 3:
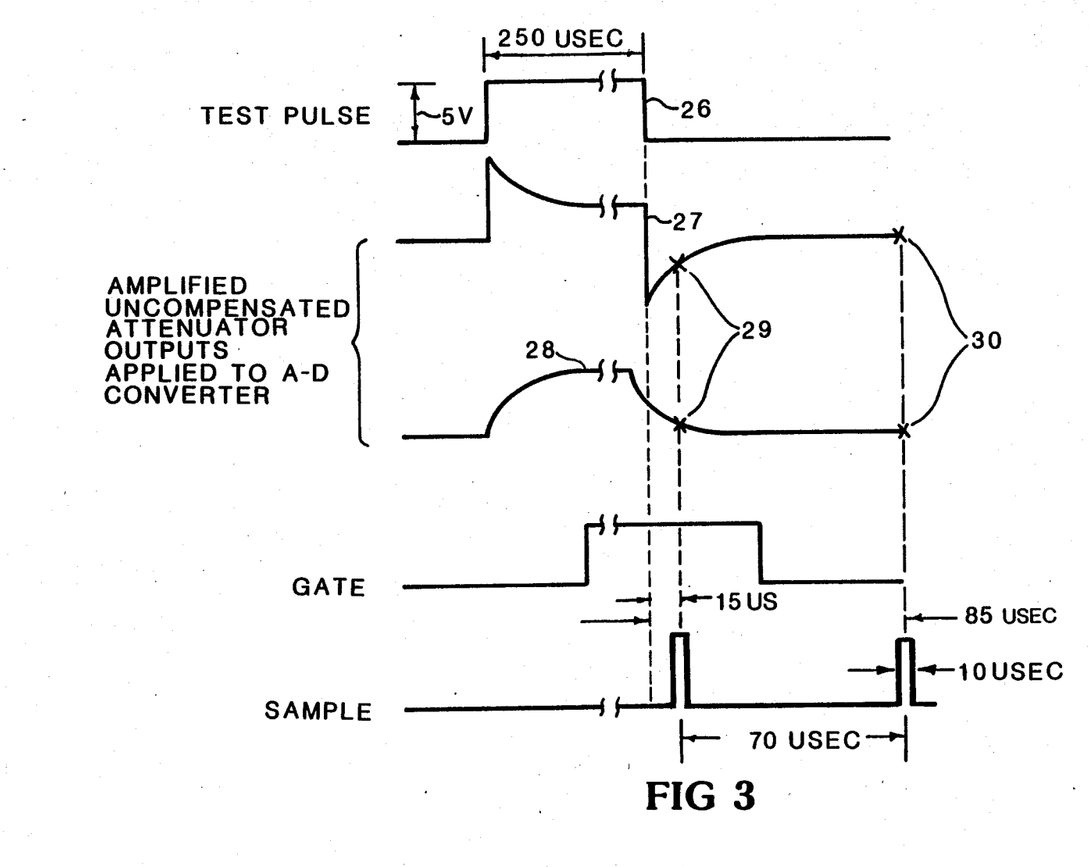
FIG. 3 is a simplified waveform diagram illustrating the operation of the block diagram of FIG. 2.

With reference now to FIG. 3, a short time later test pulse generator 22 generates a two hundred and fifty microsecond pulse 26 of approximately five volts. An easy way to generate this pulse is to simply amplify, or buffer, the associated bit in the control register 16, and so let that bit be the pulse, as it were. The test pulse 26 is applied to the input attenuator 5, which as previously mentioned, may be a 10:1 (or a 100:1) attenuator. If the attenuator 5 were well compensated then the waveform appearing at the attenuator output 6 would be a one tenth amplitude exact replica of the applied test pulse. However, a miscompensated attenuator will produce waveforms similar to either of waveforms 27 or 28 in FIG. 3. That is, it will exhibit overshoot (27) or poor rise and fall times (28). These conditions respectively represent too little and too much capacitance in parallel with resistor 32 in attenuator 5. This phenomenon is well known and is readily observed whenever an attenuator probe for an oscilloscope is compensated. What is required is an equality of time constants between the upper and lower sections of the attenuator 5. It is achieved by adjusting the apparent or effective value of virtual trimmer capacitor 20.

To that end the following actions are undertaken. Just a few microseconds after the trailing edge of the test pulse 26 the microprocessor 15 turns on the gate to the a-d converter 13. Then, approximately ten microseconds after the trailing edge of test pulse 26 the sample control line 25 is very briefly driven high (for approximately ten microseconds) to cause the a-d converter 13 to take a first sample 29. This produces a sample whose effective location is fifteen microseconds after the trailing edge of the test pulse. Approximately seventy microseconds later a second sample 30 is taken. If the input attenuator 5 is not compensated, as indicated by either of waveforms 27 or 28 in FIG. 3, then the two samples 29 and 30 will not have the same value. Conversely, if the attenuator 5 is compensated sample 30 will have the same value as its predecessor 29. It will also be noted that if the system is free of dc offsets then both samples 29 and 30 will have values of zero. No such freedom from dc offsets is required for the proper functioning of the automatic compensation mechanism, however. Nevertheless, it is advantageous if the output stage of test pulse generator 22 includes a CMOS switch to ground, as this will ensure that a good ground potential free from drifting offsets is applied to the input attenuator 5 following the trailing edge of the test pulse. Otherwise, the servo loop may receive inaccurate information about the degree of attenuator compensation.

In the HP Model 3457A a plurality of such pairs of samples is undertaken for a series of test pulses, and the results stored in RAM 31B. Each of those measurements corresponding to sample 29 are combined to form an average value. Likewise, the various samples 30 are averaged. It is then these average values that are compared as "$t_1$" and "$t_2$". As a result of this comparison the attenuation ratio of attenuator 17 is adjusted if the averaged value for samples 29 is not sufficiently close to the averaged value for samples 30 (actual equality may be elusive). Following this another set of samples are averaged to determine if the attenuator is now compensated. If not, the programmable attenuator is changed again, and yet another set of samples taken, and so on, until the difference between the averaged values indicates that the desired degree of compensation has been attained.

For the case of a positive test pulse, if sample 29 is more positive than sample 30 (as for waveform 28 in FIG. 3), then the effective value of capacitor 20 needs to be reduced. This is done by reducing the amount of attenuation provided by programmable attenuator 17, so that a greater amplitude replica of the signal at the output 6 of the input attenuator 5 is applied to amplifier 19, and hence to the lower end of virtual trimmer capacitor 20. It is, of course, simply the signal on output 6 that is at the other, or upper, end of virtual trimmer capacitor 20. Hence, by decreasing the attenuation of programmable attenuator 17 capacitor 20 has applied to each end signals that are more nearly equal in amplitude, and the effective value of virtual trimmer capacitor 20 decreases. In the case just described the value is continually decreased until the input attenuator 5 appears compensated, as indicated by a sufficiently small difference between the averaged values of samples 29 and 30.

In the event that a positive test pulse generates an output waveform similar to waveform 27 in FIG. 3, then the situation is reversed, and the averaged value of samples 29 will be negative with respect to the averaged value of samples 30. In that case the microprocessor 15 continually increases the amount of attenuation afforded by programmable attenuator 17 until the effective value of virtual trimmer capacitor 20 increases sufficiently to compensate the input attenuator 5.

Example devices suitable for use as programmable attenuator 17 include the AD7420 and AD7533 digital-to-analog converters (DAC's) manufactured by Analog Devices Corporation, Norwood, Mass.

The accuracy of the instrument is not determined or limited by the absolute accuracy of the input attenuator 5, nor necessarily by the gain of the amplifiers or the conversion characteristics of the measurement circuitry. Stability (and for ac measurements, good frequency response) is more important. Modern instruments of this type are made accurate by applying accurately known full scale values and then installing appropriate scale correction factors into a non-volatile RAM within the instrument. The microprocessor within the instrument uses the scale correction factors to convert the internally measured value to the correct value before it is displayed. Each range and each function has its own scale correction factor. Such scale correction factors are determined and stored by the microprocessor itself during the calibration procedure. The use of an automatic attenuator compensation mechanism of the type described above is of considerable utility in an instrument having stored calibration scale factors. This is because in such a device the mechanisms for frequency response and what might be called amplitude correlation (the scale factors) are essentially independent, and each must be looked after separately.

DESCRIPTION OF A SECOND PREFERRED EMBODIMENT

Figure 4:
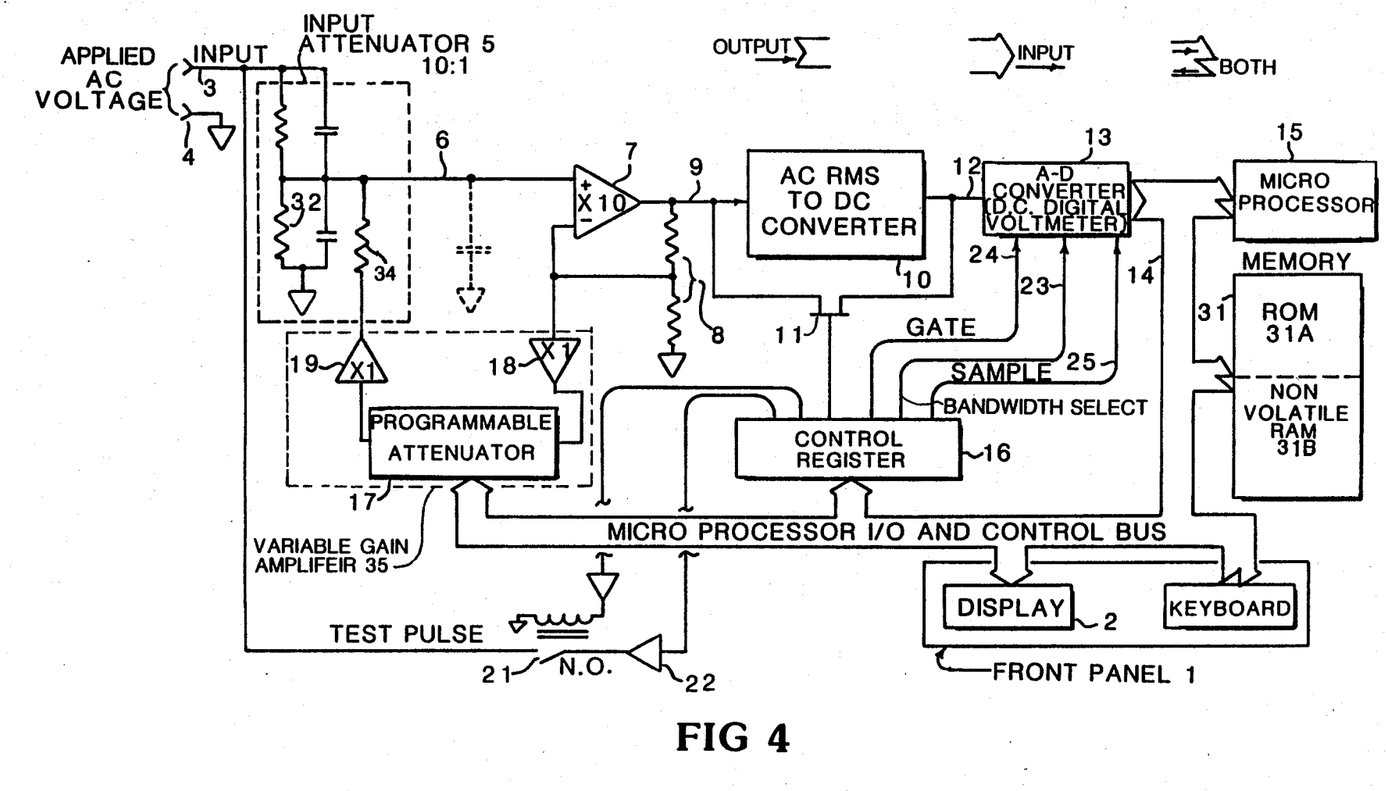
FIG. 4 is a simplified block diagram of a second preferred embodiment of the invention.

Referring now to FIG. 4, shown there is a block diagram of a second preferred embodiment of the invention. The block diagram of FIG. 4 is similar to the one of FIG. 2, and like items are identified by common reference numerals. What is different about the block diagram of FIG. 4 is that the servo controlled automatic compensation of the input attenuator 5 is obtained by driving a resistive impedance 34, in contrast with use of a capacitive impedance 20 of FIG. 2. That is, resistance 34 is operated as a virtual trimmer resistor. Also, there is in the input attenuator 5 of FIG. 4 no "hand tweak" trimmer impedance corresponding to the actual physical trimmer 33 in FIG. 2. It appears that the use or nonuse of such a trimmer in either embodiment (and if used, whether it is a resistive of capacitive impedance) is a matter of choice in the implementation.

The operation of the block diagram of FIG. 4 is sufficiently similar to that already described for FIG. 2 that what is most useful here is a summary of their differences. We may begin by noting that in FIG. 2 the ratio of the resistances in the input attenuator 5 determine the attenuation ratio at low frequencies, and that the task of compensation is to adjust the ratio of the parallel capacitances to have a like ratio of their impedances at high frequencies. When that obtains the attenuation ratio remains constant over a suitably wide range of frequencies. What this means for the block diagram of FIG. 2 is that what may be termed the "actual active compensation" is performed at the highest frequencies at which the attenuator is expected to operate. This imposes a burden of good frequency response upon variable gain amplifier 35 (i.e., upon amplifiers 18 and 19 as well as upon programmable attenuator 17). However, one potential advantage of the arrangement of FIG. 2 is that since the output of amplifier 19 is capacitively coupled to the input attenuator output 6, there is no need to eliminate or compensate for any dc offsets that may appear at the output of amplifier 19.

In contrast, the "active" compensation of the input attenuator 5 in FIG. 4 is performed at the lowest frequencies. What is done here is to let the attenuation ratio of the attenuator be determined by the existing actual capacitances in the attenuator; live with what you've got, so to speak. If the capacitance ratio is not to be changed, however, then the resistance ratio must be varied in order to bring the attenuator into compensation. That the block diagram of FIG. 4 operates in this fashion is easy to see in light of the previous explanation concerning the operation of the servo compensation principle. Basically, resistor 34 is a virtual trimmer resistor in parallel with resistor 32. If the attenuation ratio of programmable attenuator 17 is near zero the effective value of resistor 34 approaches its actual physical value. The resulting parallel combination of resistor 32 with the lower effective value of virtual trimmer resistor 34 produces a lower resistance to ground from the attenuator output 6, in comparison to situation described next. The opposite extreme occurs when the attenuation ratio of programmable attenuator 17 is near one. Then virtual trimmer resistor 34 in effect "disappears" as its apparent value increases nearly to infinity.

Another difference is, as previously mentioned, that for a virtual trimmer resistor the direction of change in the attenuation ratio of programmable attenuator 17 is opposite that used for a virtual trimmer capacitor.

A further difference is that programmable attenuator 17 and amplifiers 18 and 19 do not need to exhibit anywhere near the frequency response needed for the circuit of FIG. 2. At frequencies above the crossover point where the input attenuator 5 begins to appear capacitive rather than resistive, the contribution to compensation by the virtual trimmer resistor (or the lack of such contribution) is "swamped out" by the much lower capacitive impedance of the now primarily capacitive input attenuator. Hence, at those frequencies the accuracy of the voltage driving the virtual trimmer resistor is not of particular concern.

What the actual attenuation ratio will be for the attenuator 5 in the block diagram of FIG. 4 is difficult to predict in advance. The capacitors used in the attenuator 5 cannot be manufactured with precision and stability comparable to that of the resistors. And even if each capacitor used was individually selected on the basis of a precision measurement of its value, the particular stray capacitance in the circuit after assembly would render such attempts at precision meaningless. But there will be some definite attenuation ratio at high frequencies, and it will be just as stable or unstable as for any other attenuator. It is merely that the value of the ratio must be discovered and used "as is". For the block diagram of FIG. 4 the automatic servo loop described implicitly discovers when the low frequency attenuation ratio equals the high frequency ratio. It then operates to fix the low frequency attenuation ratio at that value. That compensates the attenuator.

There remain two additional considerations. First, to calibrate the instrument after the attenuator has been compensated in the fashion of FIG. 4, one must first compensate the attenuator and then discover what the attenuation ratio currently then is. That information is used to determine the scale factors needed to produce accurate readings. Since the high frequency attenuation ratio very accurately equals the low frequency attenuation ratio, the gain calibration can be done automatically with an "auto-cal" procedure incorporating an internal voltage standard, which can even be a dc voltage. Second, any dc offsets arising from the output of amplifier 19 must be dealt with. This is generally not difficult, and is handled by the same mechanism that nulls out or compensates for any other dc offsets that may be present. For example (and this pertains to both of FIGS. 2 and 4), relay 21 can be used to very effectively ground the input of the attenuator 5. This is done by first closing the relay, and by arranging that the output transistor of amplifier 22 be a CMOS switch to ground. Thus, the microprocessor 15 can apply a very effective ground to the input of the attenuator. It then measures and notes the indicated output. That is exactly the dc offset. It is in turn subtracted from any actual measurements subsequently made by the user with the instrument.

Variable Gain Amplifier Considerations

Variable gain amplifier 35 can be implemented in different ways, and it may be convenient or desirable for it to be capable of gains greater than one. Likewise, in some applications it might be desirable for the amplifier 35 to exhibit inversion, while in others it might not. It is to these various possibilities that we now turn our attention.

Figure 7:
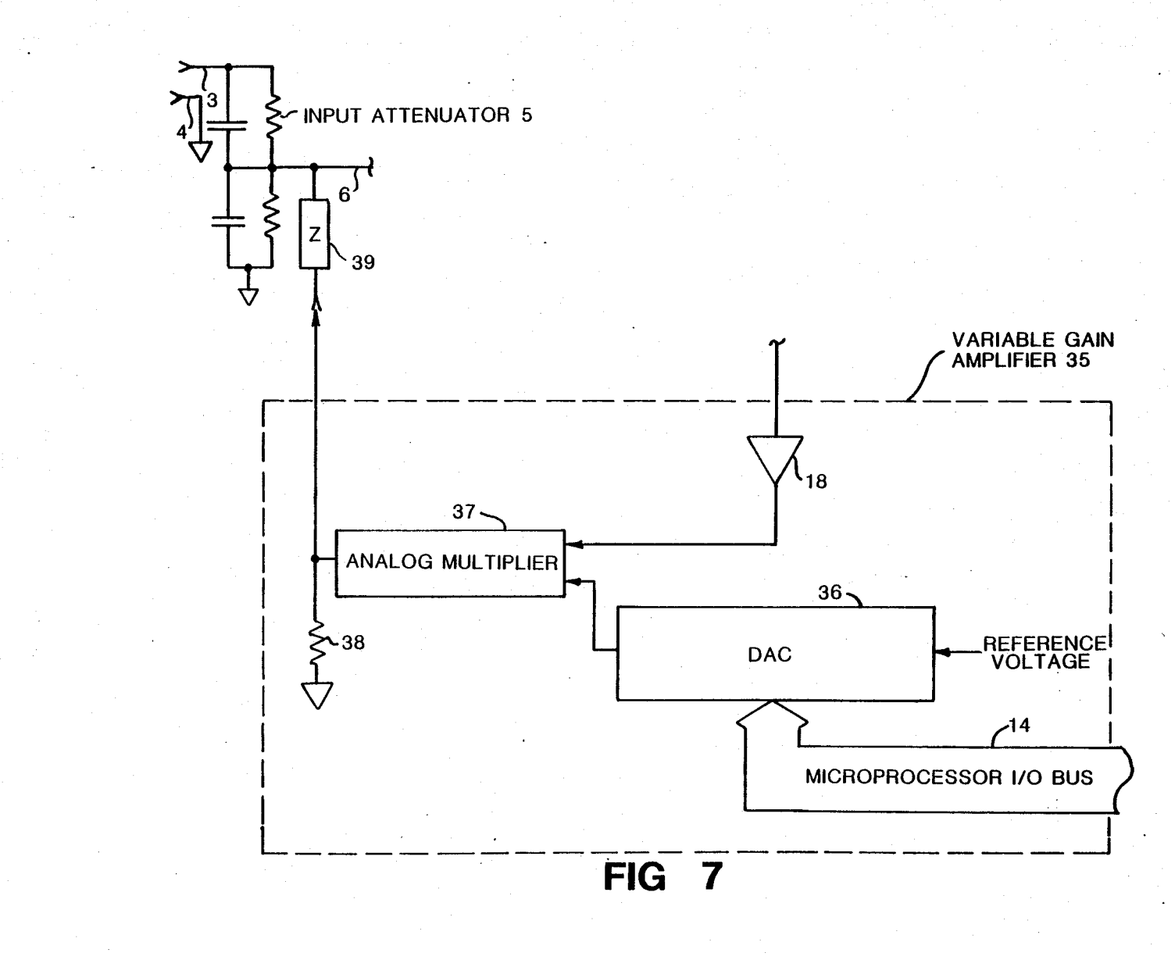
FIG. 7 is a simplified schematic segment of an alternate implementation for a variable gain amplifier used in the simplified block diagrams of FIGS. 2 and 4.

Referring now to FIG. 7, shown therein is another way to implement variable gain amplifier 35. In this circuit the ouput of amplifier 18 drives one input of an analog multiplier 37. The other input to the analog multiplier 37 is the output of a DAC 36. DAC 36 acts as a programmable voltage divider to produce from a reference voltage a suitable factor by which to multiply the output of amplifier 18. The output of the analog multiplier 37 is developed across resistor 38 and is used to drive the impedance 39 coupled to the output 6 of input attenuator 5. Some DAC's suitable for use as DAC 36 include the CMOS multiplying DAC AD7240 from Analog Devices. A suitable analog multiplier for use as analog multiplier 37 is the AD539, also from Analog Devices.

It should be noted that there is no particular range of gains that variable gain amplifier 35 must cover. It could vary from zero to one, as has been described, or it could vary from zero to two or from one to three. Let us return to the circuit of FIG. 2 and examine what the effect would be for a range of non-inverting gain of from zero to two.

Referring again to FIG. 2, when variable gain amplifier 35 has a gain within the range of zero to one the circuit works as previously described; some fractional portion of the value of capacitor 20 is added to the value of capacitor 40. When the gain of amplifier 35 is exactly one, the effective value of capacitor 20 is zero, and no change occurs in the effective value of capacitor 40. However, as the (non-inverting) gain of amplifier 35 goes above one the apparent value of capacitor 20 is negative. It does not appear inductive; the phase relationships are still characteristic of capacitance. But now the apparent value of capacitor 20 must be subtracted from that of capacitor to find the overall equivalent value. It can be seen then, that by allowing the gain of the amplifier 35 to rise above one it is possible to extend the range of compensation. In the instance just described, for example, capacitor 40 could be either slightly too big or slightly too small in value and the automatic compensation mechanism would still be able to compensate the attenuator. In contrast, the situation of FIG. 2 as originally described required that capacitor 40 be slightly too small by an amount less than (say, approximately half of) the actual physical value of capacitor 20.

A similar augmenting or dimishing by the value of the virtual trimmer impedance 39 of FIG. 7 occurs if that impedance is a resistance. In that case the result is not quite as simple as addition or subtraction, since the trimmer resistor is in parallel with resistor 32, but it is still the case that the effective value of resistor 32 both increases and decreases about its actual value.

Variable gain amplifier 35 could also exhibit inversion. Refer again to FIG. 2, only now assume that the gain of the variable gain amplifier 35 varies from zero to two and exhibits inversion. This situation at a gain of zero remains as previously described; capacitor 20 makes its full contribution. But now, when the gain is one capacitor 20 appears to have twice its physical value; it appears to have three times its value when the gain is two, and so on. A similar multiplying effect occurs for the apparent value of a virtual trimmer resistor.

As an example of how inversion and gain greater than one might be used in an actual application, suppose that it were desired to fabricate a compensated 10:1 attenuator on a chip. MOS capacitors have very good dissipation factors and low dielectric absorbtion, so the potential performance of the attenuator is very good. Furthermore, assume that the effective capacitance values needed for the attenuator are approximately 25 pf and 195 pf. There are at least three reasons why the invention described herein would be useful in this example. First, it may be neither convenient nor desirable to build a capacitor on the chip that is as large as 195 pf, simply because of the space it would require. Second, if the two capacitors were of the same size they would automatically have the same temperature coefficient as well as the same loss factors. If one of these two capacitors were driven by an inverting amplifer 35 with a gain of seven the apparent size of that capacitor would be eight times its physical value, or 200 pf. Variations in gain about a mean of seven would produce the requisite capacitance to compensate the attenuator. The third reason for using the invention is to accurately compensate a miniature attenuator without resorting either to bulky discrete components or inconvenient manual adjustments.

Servo Loop Error Signal Considerations For The Two Preferred Embodiments

A servo loop must have an error signal that correctly represents deviations in the condition to be controlled. In addition to the usual gain and bandwidth considerations used in obtaining a critically or otherwise optimally damped response from the servo control loop itself, some care must be exercised in picking the sample times $t_1$ and $t_2$ that the determine the error signal for the particular control loops of FIGS. 2 and 4.

The control loops of FIGS. 2 and 4 may be characterized as sampled control loops, as contrasted with with their continuous analog counterparts of the sort often found in simple regulated power supplies. From this perspective the samples used as inputs by the servo are not the captured voltage values $t_1$ and $t_2$, nor even their averages. It is instead their difference that is the "sample". The servo control loop does not deal directly with or even know about $t_1$ and $t_2$; it just gets a number that happens to be their difference. What that difference means in terms of the parameter that the servo loop is controlling is in part a function of how far apart in time $t_1$ and $t_2$ are separated from each other, as well as how far they are separated from the transition in the test pulse that identifies the point along the time axis that equals zero. That is, it may not be enough to know that $t_2$ follows $t_1$ by the requiste time interval; it may be important to select when $t_1$ occurs following the trailing (or leading) transition in the test pulse. Further still, there may be some altogether separate considerations influencing the selection of a location for $t_2$. We begin with some illustrations and observations about this second area of concern (the individual positions of $t_1$ and $t_2$), and then move to the first (the interval between $t_1$ and $t_2$).

Figure 5A:
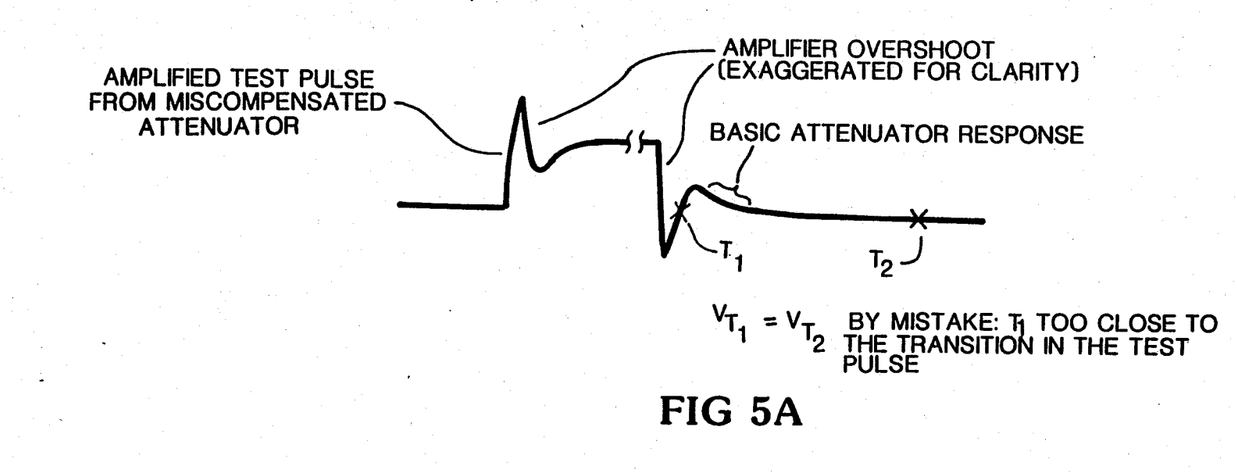
FIGS. 5A and 5B are waveform diagrams illustrating various aspects of how to select certain sampling times of FIG. 3 for a servo loop used in the preferred embodiments of FIGS. 2 and 4.

Refer now to FIG. 5A, and temporarily assume that the input attenuator is mis-compensated after the fashion of waveform 28 in FIG. 3. Suppose also that the parallel RC time constant of the lower section of the input attenuator 5 is twenty microseconds (i.e., that the value of resistor 32 multiplied by its effective parallel capacitance in, say, FIG. 2 equals 20 usec). But in contrast with the serendipitous case depicted in FIG. 3, FIG. 5A illustrates possible amplifier shortcomings whose effects must be avoided. In FIG. 5A the amplified test pulse to be sampled exhibits overshoot (somewhat exaggerated for clarity in the illustration). Worse yet, the amplifier's response might also include some ringing. If the first sample ($t_1$) occurs sufficiently close to the edge of the test pulse then the difference between $t_1$ and $t_2$ is contaminated with some spurious and unknown contribution from the amplifier. That is, the value obtained at $t_1$ could be erroneously high or low by some unknowable amout based upon where on the amplifier overshoot $t_1$ occurred. This is true regardless of whether the input attenuator 5 is actually compensated or not. Thus, if the amplifier exhibits overshoot and $t_1$ is too close to a transition in the test pulse the servo loop may act as though the input attenuator were compensated when it is not (this possibility is illustrated in FIG. 5A), or act as if it were not compensated when it was.

The lesson of FIG. 5A is that some compromise may be needed in selecting the location of $t_1$. On the one hand it is desirable for the $t_1$–$t_2$ combination to occur as early as possible in any exponential decay of the attenuator response being measured, as the rate of change $dv/dt$ is greatest then and thus provides the best signal to noise ratio for the error signal. But on the other hand, it is clearly necessary for $t_1$ to be delayed until the amplifier has settled.

Figure 5B:
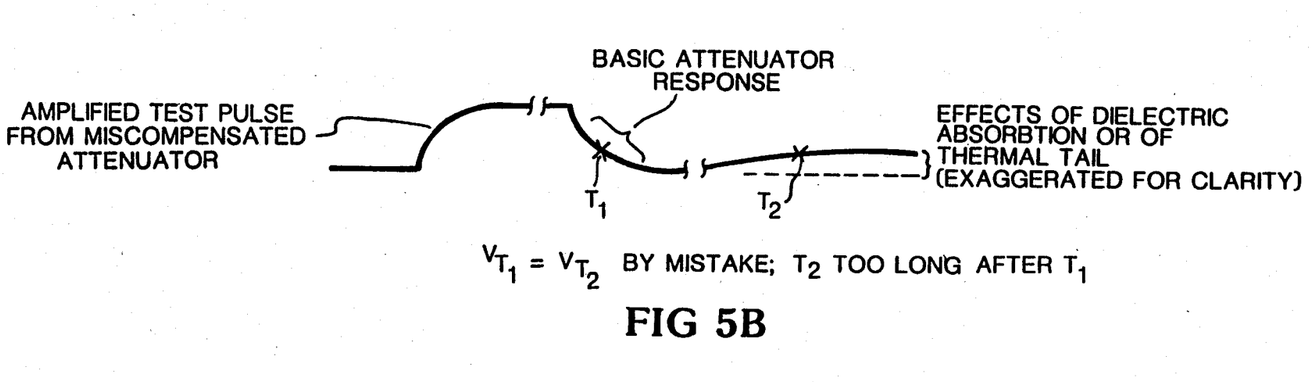

Refer now to FIG. 5B and again temporarily assume that the input attenuator 5 is mis-compensated as in FIG. 5A. It can be seen that something interferes with obtaining a true value for a $t_2$ that occurrs in the vicinity of the $t_2$ of FIG. 5A. This interference would result regardless if the reason that $t_2$ was so far along the time axis was (a) because the interval from $t_1$ to $t_2$ got very long, as is depicted in the figure, or (b) because the entire $t_1t_2$ interval of whatever duration was shifted to a point later in time such that $t_2$ ends up as shown. The error that arises as a result could be caused by at least two things. The first is dielectric absorption, and the second the presence of a "thermal tail" in the amplifier circuitry.

A thermal tail is caused by localized heating of one or more transistors an amplifier owing to a change in signal level. The heating causes a shift in operating point or produces an offset. It would seem a valid observation to note that if the amplifiers in use exhibit this property to any significant degree, then some question arises concerning the accuracy of the instrument. However, one could still compensate the attenuator by the methods described above, if $t_2$ could be obtained before the onset of the "tail". We needn't further consider the case of thermal tail.

Dielectric absorbtion is another matter. It has two separate effects. First, it has an effect upon the frequency response of the attenuation process. One way to approximately characterize dielectric absorbtion is to consider it as one or more series RC networks in parallel and connected between ground and the output of the attenuator. If this is indeed a substantially accurate model, then no amount of variation in the parallel RC values in the attenuator itself will exactly compensate the attenuator. This is true of all lumped constant attenuators, and the best that can be done is to find some acceptable compromise as to how attenuator "compensation" should be choosen to minimize the disturbance in frequency response produced by dielectric absorbtion. Sometimes the most practical compromise is to attempt to minimize dielectric absorbtion on the one hand, and simply ignore that which does result on the other. Alternatively, one might compensate the attenuator to produce the flattest frequency response in the vicinity of the crossover frequency.

Second, regardless of what compromise spoken of above is selected, care must be taken to see that time constants associated with any dielectric absorbtion do not fool the servo loop into an unwanted mis-compensation of the input attenuator. These time constants can be either shorter or longer than the time constant of the input attenuator. What is needed is a way to make the servo loop most responsive to the effects of the time constant of the input attenuator and, to as great an extent as possible, ignore the effects of the time constants associated with dielectric absorbtion.

The situation we are concerned with involves the excitation of the input attenuator by a step function. Under these circumstances the signals emmanating from the input attenuator are exponential in nature. The signals present in the attenuator output owing to dielectric absorbtion are exponential also. Assume that any time constants associated with dielectric absorbtion are different than that for the input attenuator. It can be shown that an equation can be derived describing, as a function of the sample times $t_1$ and $t_2$, the sensitivity of the servo loop to the contribution of a desired time constant present in the voltage difference produced by the samples taken at $t_1$ and $t_2$. Thus it is possible to select the sample times $t_1$ and $t_2$ such that the servo loop is most sensitive to the particular time constant associated with attenuator compensation (i.e., the time constant of the input attenuator 5) and less sensitive to either longer or shorter time constants that may be associated with dielectric absorbtion. Equation (1) below is such an equation.

$$\text{Relative sensitivity to the time constant } \tau = \frac{e^{\frac{-T_1}{\tau}} - e^{\frac{-T_2}{\tau}}}{\sqrt{\tau}} \quad (1)$$

Figure 6:
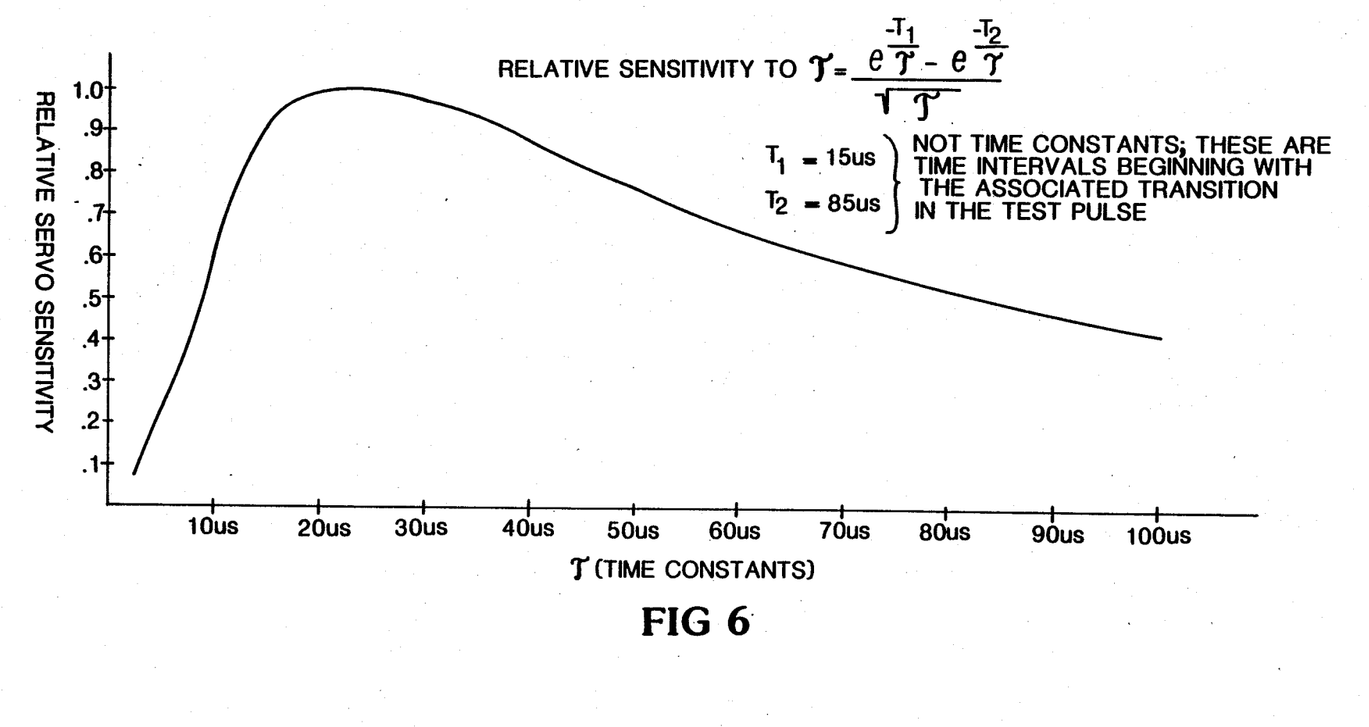
FIG. 6 is a graph illustrating how proper choice of the sampling times in FIG. 3 can reject the effects of unwanted time constants in the operation of the block diagrams of FIGS. 2 and 4.

FIG. 6 is graph illustrating the relative sensitivity of the servo loops of FIGS. 2 and 4 to a twenty microsecond time constant of the input attenuator 5 when $t_1$ occurrs fifteen microseconds after the edge of the test pulse and $t_2$ occurrs eighty-five microseconds after that edge.

We claim:

1. Voltage measure-apparatus having an attenuator automatically compensated for frequency response comprising:
   a first attenuator having an input and an output referenced to a signal ground, the first attenduator itself comprising:
   an input section connected between the input and the output of the first attenuator;
   (ii) a grounded section connected between the output of the first attenuator and the signal ground; and
   (iii) a virtual trimmer impedance connected between the output of the first attenuator and the signal output of the variable gain amplifier means recited below;
   means coupled to the output of the first attenuator for producing a measurement of the value of an AC voltage applied to the input of the first attenuator;

variable gain amplification means having a signal input coupled to the outptu of the first attenuator, having a gain control input coupled to the processing means recited below and also having a signal output;

means for applying to the input of the first attenuator a step voltage having a transition in the direction of a selected polarity;

sampling means coupled to the output of the first attenuator for making a plurality of samples subsequent to the transition in and during the ensuing duration of the step voltage applied to the first attenuator and processing means, having an input coupled to receive the samples made by the sampling means and having an output coupled to the gain control input of the variable gain amplification menas, for varying the effective value of the virtual trimmer impedance by specifying the variable gain in accordance with the values of the individual samples within the plurality thereof, thereby compensating the frequency response of the first attenuator.

2. Apparatus as in claim 1 wherein the virtual trimmer impedance comprises a capacitance, the variable gain amplification means is non-inverting and the processing mea decreases the gain of the variable gain amplification means whenever the different obtained by diminishing the value of a preceding individual sample by the value of a subsequent individual sample is of the the same polarity as the transition in the step voltage and increases the gain whenever the difference is of the opposite polarity.

3. Apparatus as in claim 1 wherein the virtual trimmer impedance comprises a capacitance, the variable gain amplification means is inverting and the processing means increases the gain of the variable gain amplification means whenever the difference obtained by diminishing the value of a preceding individual sample by the value of a subsequent individual sample is of the the same polarity as the transition in the step voltage and decreases the gain whenever the difference is of the opposite polarity.

4. Apparatus as in claim 1 wherein the virtual trimmer impedance comprises a resistance, the variable gain amplification means is non-inverting and the processing means increases the gain of the variable gain amplification means whenever the difference obtained by diminishing the value of a preceding individual sample by the value of a subsequent individual sample is of the the same polarity as the transition in the step voltage and decreases the gain whenever the difference is of the opposite polarity.

5. Apparatus as in claim 1 wherein the virtual trimmer impedance comprises a resistance, the variable gain amplification means is inverting and the processing means decreases the gain of the variable gain amplification means whenever the difference obtained by diminishing the value of a preceding individual sample by the value of a subsequent individual sample is of the the same polarity as the transition in the step voltage and increases the gain whenever the difference is of the opposite polarity.

6. Apparatus as in claim 1 wherein the processing means sustains the existing gain of the variable gain amplification means whenever the absolute value of the difference between the value of a preceding individual sample and the value of a subsequent individual sample is less than a selected value.

7. Apparatus as in claim 1 wherein the variable gain amplification means comprises a first amplifier whose output is coupled to the input of a programmable attenuator whose output is coupled to the input of a second amplifier, the signal input to the variable gain amplification means being the input to the first amplifier, the signal output of the variable gain amplification means being the output of the second amplifier and the gain control input to the variable gain amplification means being a programming input of the programmable attenuator.

8. Apparatus as in claim 1 wherein the variable gain amplification means comprises a first amplifier having an output coupled to a first input of an analog multiplier, a digital to analog converter having a signal input operated at a reference voltage and a signal output coupled to a second input of the analog multiplier, the signal input to the variable gain amplification means being the input to the first amplifier, the signal output of the variable gain amplification means being an output of the analog multiplier, and the gain control input to the variable gain amplification means being a programming input of the digital to analog converter.

9. Apparatus as in claim 1 wherein a preceding individual sample and a subsequent individual sample within the plurality thereof each occur after the transition in the step voltage by respective amounts of time selected to maximize the degree to which the difference between the values of those samples is indicative of mis-compensation of the first attenuator.

10. Apparatus as in claim 1 wherein a preceding individual sample and a subsequent individual sample within the plurality thereof each occur after the transition in the step voltage by respective amounts of time selected to maximize the degree to which the difference between the values of those samples represents an exponential voltage waveform having a time constant equal to that of the first attenuator.

11. A method of compensating the frequency response of an attenuator comprising the steps of:
first,
 a. applying an abrupt step in voltage to the input of an attenuator to produce an attenuated voltage step;
 b. sampling, subsequent to step a, the attenuated voltage step a plurality of times;
 c. determining for the plurality of samples a difference therebetween;
 d. amplifying the attenuated step by a gain selected in accordance with the determined difference;
 e. coupling the amplified attenuated voltage step through an impedance to the output of the attenuator;
 f. if the different of step c exceeds a selected limit then changing the selected gain used in step d to produce a smaller difference in step c; and
 g. repeating steps a-f until the difference of step c no longer exceeds the selected limit in step f;
then,
 h. applying a work voltage to be measured to the input of the attenuator;
 i. amplifying the attenuated work voltage by the changed selected gain determined in step f; and
 j. coupling the amplified attenuated work voltage through the impedance to the output of the attenuator.

12. A method as in claim 11 wherein:

the impedance coupled in steps e and j is a capacitance;

the amplifying steps d and i are non-inverting;

the determining step c further determines whether a preceeding sample of the plurality in step b diminished by a subsequent sample of that plurality produces a difference of the same polarity as the abrupt step in voltage of step a, or if that difference is of the opposite polarity; and the changing step f decreases the gain used in steps d and i whenever the determining step c produces a difference of the same polarity and increases the gain used in steps d and i whenever the determining step c produces a difference of the opposite polarity.

13. A method as in claim 11 wherein:

the impedance coupled in steps e and j is a capacitance;

the amplifying steps d and i are inverting;

the determining step c further determines whether a preceeding sample of the plurality in step b diminished by a subsequent sample of that plurality produces a difference of the same polarity as the aburpt step in voltage of step a, or if that difference is of the opposite polarity; and the changing step f increases the gain used in steps d and i whenever the determining step c produces a difference of the same polarity and decreases the gain used in steps d and i whenever the determining step c produces a difference of the opposite polarity 14. a method as in claim 11 wherein:

the impedance coupled in steps e and j is a resistance;

the amplifying steps d and i are non-inverting;

the determining step c further determines whether a preceeding sample of the plurality in step b diminished by a subsequent sample of the plurality produces a difference of the same polarity as the abrupt step in voltage of step a, or if that difference is of the opposite polarity; and the changing step f increases the gain used in steps d and i whenever the determining step c produces a difference of the same polarity and decreaes the gain used in steps d and i whenever the determining step c produces a difference of the opposite polarity 15. A method as in claim 11 wherein the impedance coupled in steps e and j is a resistance;

the amplifying steps d and i are inverting;

the determining step c further determines whether a preceeding sample of the plurality of step b diminished by a subsequent sample of that plurality produces a difference of the same polarity as the abrupt step in voltage of step a, or if that difference is of the opposite polarity; and the changing step f decreases the gain used in steps d and i whenever the determining step c produces a difference of the same polarity and increases the gain used in steps d and i whenever the determining step c produces a difference of the opposite polarity.

16. A methodas in claim 11 wherein the sampling step b samples the attenuated voltage step at a plurality of times selected to maximize the degree to which the difference of the determining step c is indicative of miscompensation of the attenuator.

17. A method as in claim 11 wherein the sampling step b samples the attenuated voltage step at a plurality of times selected to maximize the degree to which the difference of the determining step c represents an exponential voltage waveform having a time constant equal to that of the attenuator.

18. A method of compensating the frequency response of an attenuator comprising the steps of:

creating a scaled replica of the voltage appearing at the output of the attenuator;

driving the output of the attenuator with the scaled replica through a virtual trimmer impedance; and varying the effective value of the virtual trimmer impedance be changing the scale of the replica.

19. A method of compensating he frequency response of an attenuator comprising the steps of:

creating a scaled replica of the AC components above a selected frequency in the voltage appearing at the output of the attenuator;

driving the output of the attenuator with the scaled replica through a virtual trimmer capacitance; and varying the effective value of the virtual trimmer capacitance by changing the scale of the replica.

20. A method of compensating the frequency response of an attenuator comprising the steps of:

creating a scaled replica of the DC and AC components below a selected requency in the voltage appearing at the output of the attenuator;

driving the output of the attenuator with the scaled replica through a virtual trimmer resistance; and varying the effective value of the virtual trimmer resistance by changing the scale of the replica.

* * * * *

UNITED STATES PATENT AND TRADEMARK OFFICE
CERTIFICATE OF CORRECTION

PATENT NO. : 4,663,586  Page 1 of 2
DATED : May 5, 1987
INVENTOR(S) : Ronald L. Swerlein, Lawrence A. DesJardin and Scott Stever It is certified that error appears in the above-identified patent and that said Letters Patent is hereby corrected as shown below:

Col. 10, Line 34,   "eqalIs" should read --equals--;

Col. 13, Line 44,   "transistors an" should read --transisitors in an--

CLAIMS

Col. 14, Line 56,   "attenduator" should read --attenuator--

Col. 14, Line 58,   "an input" should read --(i) an input--;

Col. 15, Line 2,    "outptu" should read --output--;

Col. 15, Line 13,   "attenuator and" should read --attenuator; and--;

Col. 15, Line 17,   "menas" should read --means--;

Col. 15, Line 26,   "mea" should read --means--;

Col. 15, Line 27,   "different" should read --difference--;

Col. 16, Line 55,   "different" should read --difference--;

Col. 17, Line 31,   "ity" should read --polarity--;

Col. 17, Line 32,   "a method" should read --A method--;

Col. 17, Line 43,   "decreaes" should read --decreases--;

Col. 17, Line 46,   "ity" should read --ity.--;

UNITED STATES PATENT AND TRADEMARK OFFICE
CERTIFICATE OF CORRECTION

PATENT NO. : 4,663,586
DATED : May 5, 1987
INVENTOR(S) : Ronald L. Swerlein, Lawrence A. DesJardin and Scott Stever It is certified that error appears in the above-identified patent and that said Letters Patent is hereby corrected as shown below:

Col. 17, Line 47, "wherein" should read --wherein:--;

Col. 18, Line 2, "of step b" should read --in step b--;

Col. 18, Line 13, "methodas" should read --method as--;

Col. 18, Line 31, "impedance be" should read --impedance by--;

Col. 18, Line 32, "he frequency" should read --the frequency--;

Col. 18, Line 44, "requency" should read --frequency--.

Signed and Sealed this

Nineteenth Day of December, 1995

Attest:

BRUCE LEHMAN

*Attesting Officer*     Commissioner of Patents and Trademarks